US007939987B1

(12) United States Patent
Solal et al.

(10) Patent No.: US 7,939,987 B1
(45) Date of Patent: May 10, 2011

(54) ACOUSTIC WAVE DEVICE EMPLOYING REFLECTIVE ELEMENTS FOR CONFINING ELASTIC ENERGY (75) Inventors: Marc Solal, Longwood, FL (US); Robert Aigner, Ocoee, FL (US); Julien Gratier, Apopka, FL (US); Taeho Kook, Orlando, FL (US); Benjamin P. Abbott, Longwood, FL (US)

(73) Assignee: Triquint Semiconductor, Inc., Orlando, FL (US)

( * ) Notice: Subject to any disclaimer, the term of this patent is extended or adjusted under 35 U.S.C. 154(b) by 278 days.

(21) Appl. No.: 12/256,494

(22) Filed: Oct. 23, 2008

(51) Int. Cl.
*H03H 9/145* (2006.01)
*H03H 9/25* (2006.01)

(52) U.S. Cl. ............ 310/313 R; 310/313 B; 310/313 D; 333/195

(58) Field of Classification Search .............. 310/313 D; 333/195
See application file for complete search history.

(56) References Cited

U.S. PATENT DOCUMENTS

| | | | | |
|---|---|---|---|---|
| 3,662,293 | A * | 5/1972 | De Vries | 333/151 |
| 3,836,876 | A * | 9/1974 | Marshall et al. | 333/111 |
| 4,055,820 | A * | 10/1977 | Solie | 333/153 |
| 4,155,056 | A * | 5/1979 | Cross et al. | 333/195 |
| 4,204,178 | A * | 5/1980 | Mitchell | 333/194 |
| 4,210,883 | A * | 7/1980 | Shah et al. | 333/195 |
| 4,267,534 | A * | 5/1981 | Tanski | 333/153 |
| 4,336,514 | A * | 6/1982 | Paige | 333/195 |
| 4,504,759 | A | 3/1985 | Schofield | |
| 4,598,224 | A * | 7/1986 | Ballato | 310/313 R |
| 4,598,261 | A * | 7/1986 | Ballato | 333/195 |
| 4,731,595 | A * | 3/1988 | Wright | 333/195 |
| 7,135,805 | B2 * | 11/2006 | Yamanouchi | 310/313 D |
| 7,830,067 | B2 * | 11/2010 | Matsuda et al. | 310/313 R |
| 2007/0210676 | A1 * | 9/2007 | Matsuda et al. | 310/326 |
| 2008/0211602 | A1 * | 9/2008 | Khelif et al. | 333/193 |

FOREIGN PATENT DOCUMENTS

JP 54100238 A * 8/1979

OTHER PUBLICATIONS

Olli Homgren, Tapani Makkonen, Jouni Knuuttila, Mikko Kalo, Victor Plessky, and William Steichen; "Side Radiation of Rayleigh Waves from Synchronous SAW Resonators"; IEEE Transactions on Ultrasonics, Ferroelectrics, and Frequency Control, vol. 54, No. 4, Apr. 2007; pp. 861-869.
Sarah Benchabane, Abdelkrim Khelif, William Daniau, Laurent Robert, Valerie Petrini, Badreddine Assouar, Brice Vincent, Omar Elmazria, Jan Kruger, and Vincent Laude; "Silicon Phononic Crystal for Surface Acoustic Waves"; 2005 IEEE Ultrasonic Symposium; pp. 922-925. J. Kaitila, M. Ylilammi, Juha Ella, and R. Aigner; "Spurious Resonance Free Bulk Acoustic Wave Resonators"; 2003 IEEE Ultrasonics Symposium; pp. 84-87.
Julius Koskela, Jouni Knuuttila, Tapani Makkonen, Victor Plessky, and Martti Salomaa; "Acoustic Loss Mechanisms in Leaky SAW Resonators on Lithium Tantalate"; IEEE Transactions on Ultrasonics, Ferroelectrics and Frequency Control; vol. 48, No. 6; Nov. 2001; pp. 1517-1526.

* cited by examiner

*Primary Examiner* — J. SanMartin
(74) *Attorney, Agent, or Firm* — Allen, Dyer, Doppelt, Milbrath & Gilchrist, P.A.

(57) ABSTRACT

An acoustic wave device includes electrodes carried on a surface of a piezoelectric material and an array of reflective obstacles such that elastic energy resulting from a piezoelectric effect is preferentially directed along a primary wave propagation path. The array of reflective obstacles are positioned generally parallel to the surface of the piezoelectric material and redirect acoustic waves typically reflected in other than a desirable direction to along a desired direction generally along the primary propagation path. The obstacles improve performance for SAW and BAW devices by effecting reflected energy and suppressing spurious modes.

24 Claims, 14 Drawing Sheets

|  | PREVIOUS ART | NEW |
|---|---|---|
| RESONANCE Q | 575.1386 | 1108.2031 |
| ANTIRESONANCE Q | 515.0261 | 729.4267 |
| COUPLING FACTOR | 0.057695 | 0.06539 |

ACOUSTIC WAVE DEVICE EMPLOYING REFLECTIVE ELEMENTS FOR CONFINING ELASTIC ENERGY

FIELD OF INVENTION

The present invention generally relates to the field of acoustic wave devices using piezoelectric materials, and more particularly to an acoustic wave device employing electrodes carried on a surface of a piezoelectric material and reflective obstacles acting as reflectors confining generated elastic energy.

BACKGROUND OF THE INVENTION

Figure 1:
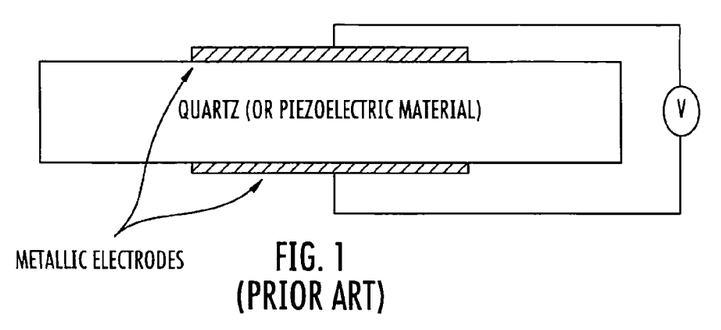
FIG. 1 is a diagrammatical illustration of a known quartz resonator circuit.

Elastic or acoustic waves are typically used for a long time to design devices like resonators or filters. A well known example is the quartz resonator using Bulk Acoustic Waves illustrated by way of example with reference to FIG. 1. The principle is to use the piezoelectric effect of quartz to transform electric energy to acoustic energy inside a quartz crystal. Then, a resonance mode is obtained at the frequency such that the thickness of quartz plate is equal to half a wavelength. These devices are typically used at relatively low frequencies (some kHz to some MHz).

Figure 2:
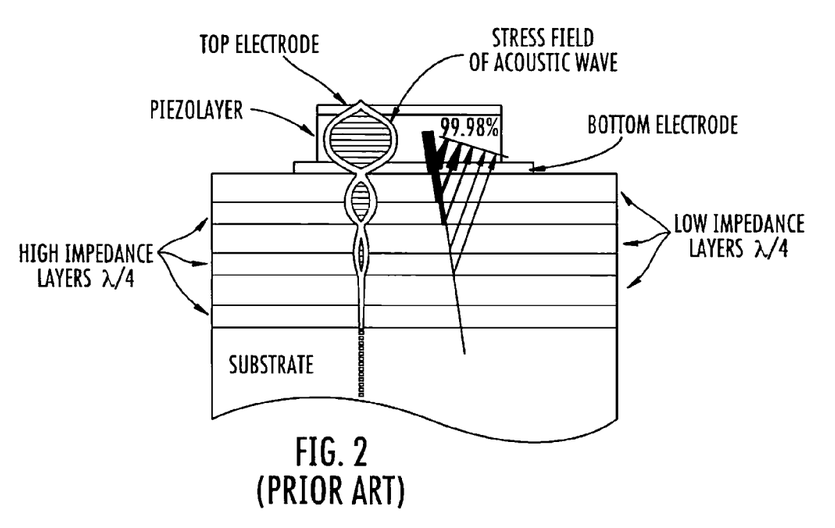
FIG. 2 is a diagrammatical illustration of a known solidly mounted resonator.

At higher frequencies (GHz range), the same principle can be applied. Since the wavelength is in the range of some micrometers, the thickness of the piezoelectric material is now very thin. To be able to manufacture these devices, thin film deposition techniques have to be used. Typically, thin films are deposited on a wafer. To confine the acoustic energy inside the piezoelectric film, the film can be mechanically isolated of the substrate by air (membrane approach) or reflective layers can be inserted between the substrate and the film (Solidly Mounted Resonator) as shown on FIG. 2.

SAW devices use so-called interdigitated transducers at the surface of piezoelectric substrates as illustrated with reference to FIG. 3. By piezoelectric effect, elastic waves are generated at the surface of the substrate. For resonators, the transducer is placed between two gratings. When the period of the grating is close to half the acoustic wavelength, the waves reflected on the individual electrodes are in phase and the grating reflects all the energy.

In all the devices described before, the elastic energy is confined for one direction. For example, for the quartz resonator or the thin film resonator, the energy is confined in the thickness of the piezoelectric film. For the SAW resonator, the energy is confined between the two gratings in the direction perpendicular to the electrodes. But for all these devices, it is difficult to confine the energy in the other directions. For the quartz resonators or the thin film resonator, the energy is confined below the electrodes thanks to the mass of the electrodes but spurious modes are often observed. In addition, some acoustic energy is often radiated outside of the resonator resulting in losses. For the SAW device, the lower velocity in transducers and gratings can result in wave guiding the energy inside the active aperture, but again, this also results in several modes and very often some energy is radiated resulting in losses. For example, for SAW RF resonators using Leaky SAW on Lithium Tantalate, it is known that acoustic radiation occurs and generates loss. Such is described in [1] J. Koskela, J. V. Knuuttila, T. Makkonen, V. P. Plessky, M. M. Salomaa, "Acoustic Loss Mechanisms in Leaky SAW Resonators on Lithium Tantalate", IEEE Trans. On UFFC, vol. 48, no6, November 2001, pp 1517-1526; and [2] O. Holmgren, T. Makkonen, J. V. Knuuttila, M. Kalo, V. P. Plessky, W. Steichen, "Side Radiation of Rayleigh Waves from Synchronous SAW Resonators", IEEE Trans. On UFFC, vol 54, no 4, April 2007, pp 861-869.

For SAW filters on quartz, transverse modes occur often resulting in ripple in the pass band or spurious emissions in the rejection band. One technique to excite only one mode is to adapt the velocity profiles in such a way that a mode having a flat amplitude in the active region can exist. This mode is then matched to the excitation profile meaning that it will be (almost) the only one excited. This technique called "piston mode" can be applied for both the BAW devices, as described in [3] J. Kaitila, M. Ylilammi, J. Ella, and R. Aigner, "Spurious resonance free bulk acoustic wave resonators", in Proc. IEEE Ultrasonics symp, 2003, pp. 84-87; and for SAW devices, as described in [4] SAW FILTER OPERABLE IN A PISTON MODE, U.S. application Ser. No. 11/863,479 filed Sep. 28, 2007.

Even though it is efficient to reduce the spurious modes, some energy may still radiate outside of the resonators. It is desirable to suppress both the spurious modes and the radiation loss. In certain conditions, a grating having a two dimensional (2D) array of periodically placed obstacles can reflect any incident elastic wave with any incidence angle in a given frequency band. This is referred to as a "phononic crystal" or "phononic band gap" effect. The principle is that for a given incidence angle, the waves reflected on obstacles are all in phase for a frequency for which the period for this angle is half the wavelength (or a multiple of half a wavelength). The reflection coefficient on the grating is close to one inside a frequency band proportional to the reflection coefficient on one individual reflective obstacle. When the incidence angle varies, the center of this frequency band moves. If the individual reflection coefficient is large enough, a frequency band can exist when the reflection on the grating is close to one for all incidence angles. These phononic crystals have the potentiality to be used in a lot of devices and are very actively studied. By way of example as described in [5] A. Khelif, A. Choujaa, S. Benchabane, V. Laude and B. Djafari-Rouhani, "GUIDING AND FILTERING ACOUSTIC WAVES IN A TWO-DIMENSIONAL PHONONIC CRYSTAL", 2004 IEEE Ultrasonics symp. proc, pp 654-657, a description is provided for possible applications of these devices for low frequencies. By way of further example, the application of phononic crystals to SAW devices is described in [6] Sarah Benchabane et al., "Silicon Phononic Crystal for Surface Acoustic Waves", 2005 IEEE Ultrasonics symp. proc. pp 922-925. In these above described disclosures, very strong reflectors are used like holes as elements of the crystal.

SUMMARY OF THE INVENTION

Features and advantages in accordance with the present invention may be provided by an acoustic wave device according to the teachings of the present invention may comprise a piezoelectric material and metallic electrodes carried by the piezoelectric material such that a difference of potential between two adjacent electrodes generates elastic energy by piezoelectric effect, wherein a primary wave propagation of acoustic waves is along a primary wave propagation path generally perpendicular to the metallic electrodes. A plurality of obstacles is positioned for reflecting at least a portion of the acoustic waves and may be positioned generally parallel to a surface of the piezoelectric material for confining the elastic energy along the primary wave propagation path, wherein obstacles within the plurality of obstacles are separated by a preselected periodicity, and wherein at least one direction of periodicity is parallel to the metallic electrodes.

Yet further, the plurality of obstacles may comprise a two dimensional periodic reflective obstacle array having periodicities parallel to and perpendicular to the direction of acoustic wave propagation. To confine the energy inside acoustic devices, one embodiment of the present invention superposes a two dimensional periodic grating on an elastic device, wherein energy is reflected in all directions and for most directions will reduce energy loss of the device and suppress the spurious modes.

Embodiments may comprise obstacle periodicities having an integer number of half elastic wave wavelength. By way of example, periodicities may be at most three elastic wavelengths. Metallic electrodes may form an interdigitated transducer (IDT) and the grating comprise a two dimensional grating of obstacles. The period of the obstacles may be essentially the same as the period of the electrodes of the IDT. The period of the obstacles may be sufficiently small to allow more than 5 periods in a device aperture. The IDT may lie between two reflectors so as to form a resonator having periodic metallic electrodes, and wherein the gratings comprise a two dimensional grating of reflective obstacles such that the period of the obstacles are essentially the same as the period of the reflectors.

A grating of obstacles may further comprise dotted metallic layer deposited on a surface of the metallic electrodes. The dotted metallic layer may be deposited on at least one of an upper surface and a lower surface of the metallic electrodes. The grating of obstacles may comprise the dotted metallic layer having obstacles separated on the electrodes by a least one dielectric layer.

The obstacles may be made of stripes of a dielectric material attached at least one of above and below the electrodes. Yet further, the obstacles may be made of strips of material separated from the electrodes by a dielectric material. The obstacles may also be stripe shaped grooves in a dielectric material carried on an upper surface of the electrodes. The obstacles are made of stripe shaped grooves within a surface of the piezoelectric substrate. The obstacles may comprise Molybdenum, Aluminum, Silicon Nitride, Aluminum Nitride, or Silicon Oxide. The obstacles and the electrodes may be shifted to provide unidirectionality.

The electrodes and obstacles may form a SAW filter comprising at least one of a SAW transducer and a resonator. The transducer and the two dimensional grating of obstacles may also form a bulk acoustic wave (BAW) resonator. The BAW resonator may comprise a Bragg reflector isolating the resonator from the substrate and confining the energy in a first direction corresponding to the thickness of a piezoelectric layer and the two dimensional grating of obstacles to confining the energy in other directions.

BRIEF DESCRIPTION OF THE DRAWINGS

Embodiments of the invention are described, by way of example, with reference to the accompanying drawings in which:

FIGS. 17 and 17A are a diagrammatical examples of a thin film BAW resonator with improved energy confinement, wherein FIG. 17 is a partial cross section view of the device and FIG. 17A is a plan view of the electrode;

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 3:
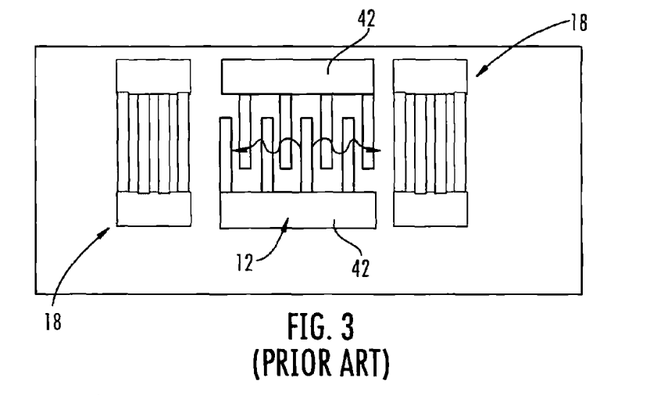
FIG. 3 is a diagrammatical schematic illustration of a SAW resonator.

Referring now to FIG. 3 with regard to SAW resonators, the period for the electrodes in the gratings and the transducers is close to half of the wavelength at the resonance frequency. Therefore, the reflected waves on the successive electrodes are in phase so that the global reflection coefficient is close to 1 and that the energy is confined in the resonator. This is the basic principle of a SAW resonator, but works only for the wave propagating in the horizontal direction. As described in the above references [1] and [2] for leaky SAW resonators, some energy is radiating outside of the resonator in the bus-bars. This energy radiation results in degradation of the resonator Q. For SAW resonators, on quartz it is known that transverse modes exist and can be problematic for filter applications. To avoid these issues, reflective obstacles periodic in the vertical (transverse) direction are added to the resonator of FIG. 3.

Figure 4:
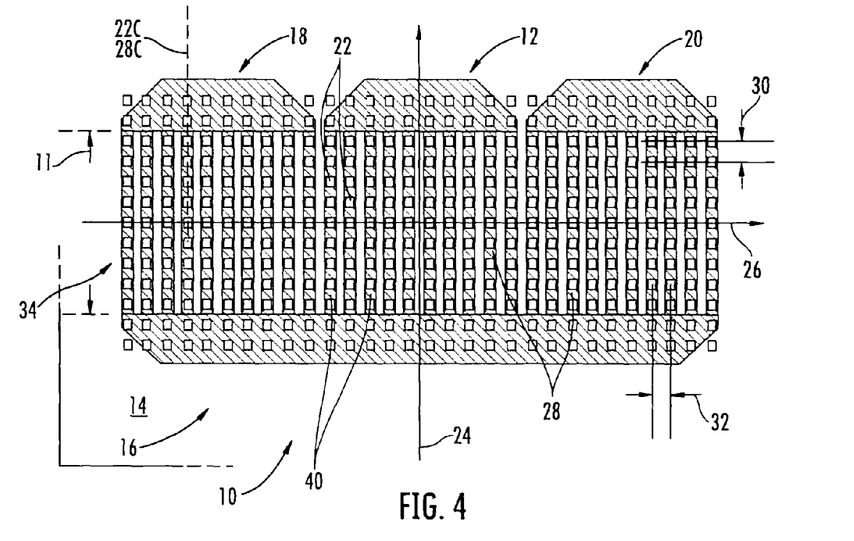
FIG. 4 is a diagrammatical plan view of one SAW resonator according to the teachings of the present invention illustrated by way of example.

As illustrated herein by way of example with reference to FIG. 4, one SAW resonator 10 may comprise a transducer 12 carried on a surface 14 of a piezoelectric substrate 16 between two electrode reflectors 18, 20. The electrode reflectors 18, 20 and transducer 12 are structured as is typical in the art. However, according to the teachings of the present invention, other acoustic wave reflectors, herein referred to as obstacles 22, or as dots for selected embodiments, are periodically placed in a transverse direction 24 and longitudinal direction 26, so as to form an obstacle array, and for the SAW resonator 10 added to each of the electrodes 28. For the SAW device herein described by way of example, the longitudinal direction 26 is a direction of propagation for primary acoustic waves. The reflective obstacles 22 herein described have periodicities along the longitudinal direction 26 (the primary SAW propagation direction) and perpendicular to the primary SAW propagation, such as along the transverse direct 24. The obstacles 22 may be added above the electrodes 28 or below, as desired. One embodiment includes a transverse period 30 of the obstacles 22 being relatively close to a horizontal period 32 of the electrodes 28, but does not have to be identical. All obstacles 22 in successive electrodes 28 may be aligned in square grid pattern 34, as illustrated with reference to FIG. 4 or with alternating shifted obstacles 36 from one electrode 28 to an adjacent electrode 28A producing an offset pattern 38 as illustrated with reference to FIG. 5, by way of example.

Figure 5:
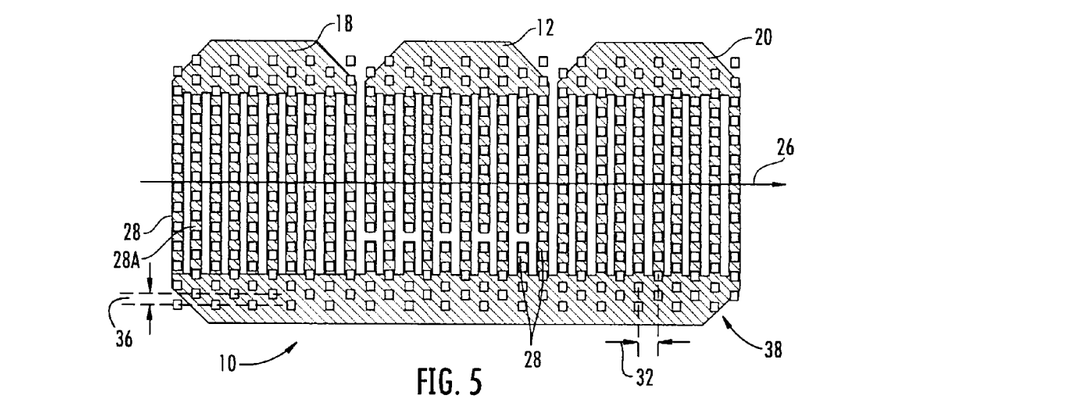
FIG. 5 is a diagrammatical plan view of a second SAW resonator according to the teachings of the present invention illustrated by way of further example.

With such a configuration using the obstacles or dots 22, the energy generated inside the transducer 12 is reflected by the obstacles 22 and energy radiation loss is reduced or suppressed in directions other than the primary acoustic wave path along the longitudinal direction 26.

Figure 6A:
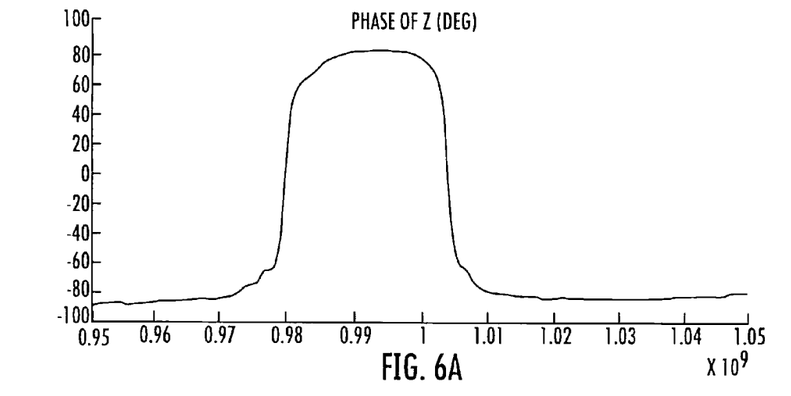
FIGS. 6A and 6B are plots of phase and amplitude of impedance, respectively, for one known resonator.
Figure 6B:
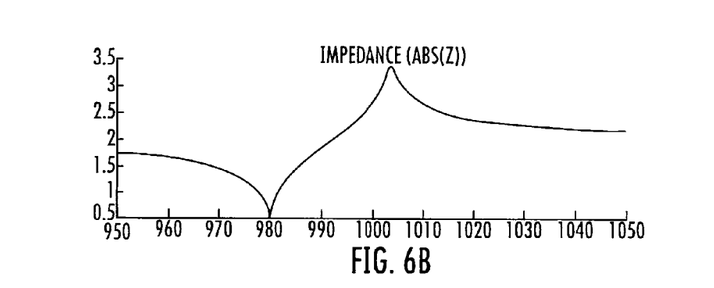
Figure 6C:
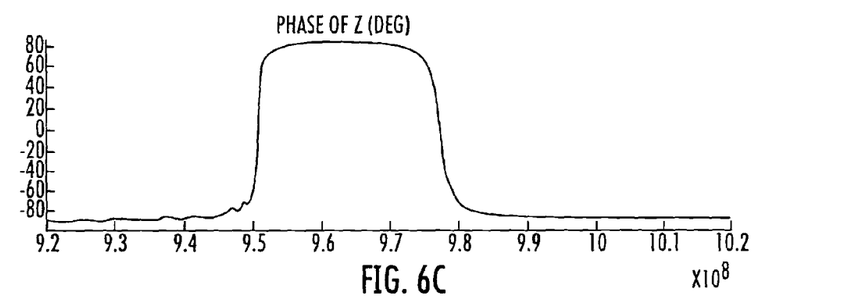
FIGS. 6C and 6D are plots of phase and amplitude of impedance, respectively, for one resonator embodiment according to the teachings of the present invention.
Figure 6D:
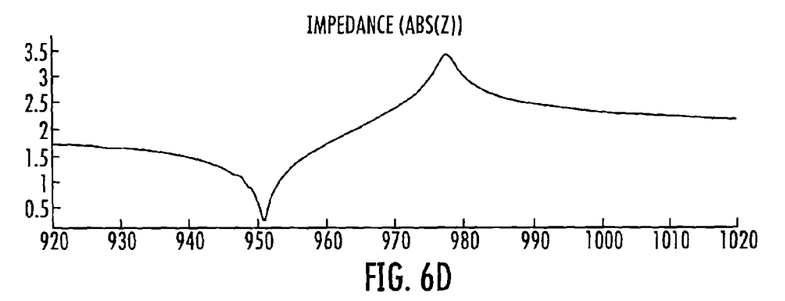

To illustrate this, reference is made to FIGS. 6A-6C, where a comparison of results for the resonator 10 with and without the obstacles 22 is illustrated. In this case, the piezoelectric substrate 16 is a rotated 48° Y-cut X propagation Lithium Tantalate. Tungsten is used as the material for the obstacles 22. Alternatively and by way of further example, the dots or obstacles 22 may be formed from Molybdenum, Aluminum, Silicon Nitride, Aluminum Nitride, and Silicon Oxide.

By way of example with continued reference to FIG. 5, the transducer 12 and electrode reflector 18, 20 period 32 is 2.0 microns. The electrodes 28 are aluminum having a thickness of 3700 angstroms. Tungsten has been chosen as material for the obstacles 22. For the example herein presented, the obstacles 22 appear as "dots on a top surface of the electrodes 28. The thickness of the dots 22 is 300 angstroms while their period 30 is 2.2 microns. The aperture 11 of the resonator 10 is 30 microns (i.e. 7.5 wavelengths), which is a relatively narrow aperture for a SAW resonator. The obstacles or dots 22 are herein alternated in the offset pattern 38.

Figure 7:
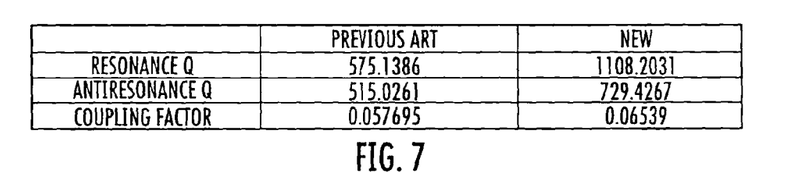
FIG. 7 is table for comparison of the resonator parameters for sample resonators described with reference to FIGS. 3, 5 and 6.
Figure 8:
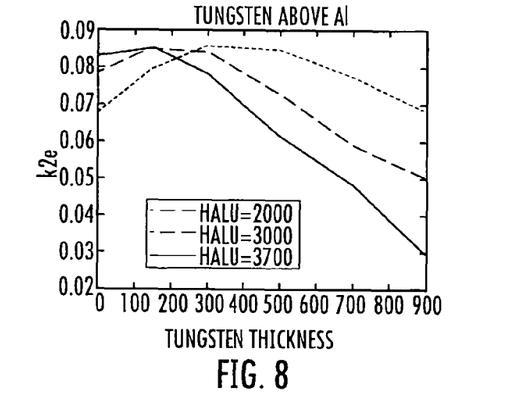
FIG. 8 is a plot illustrating a simulated coupling factor for a tungsten layer above aluminum and a period of 2 µm.
Figure 8A:
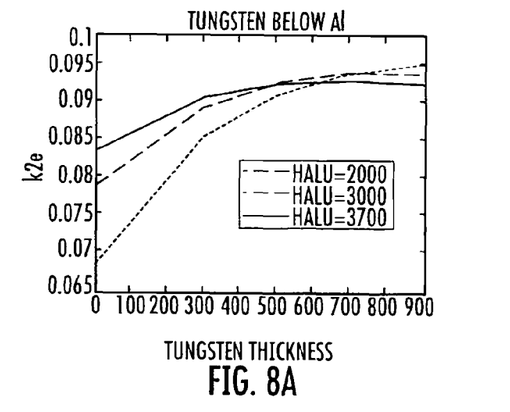
FIG. 8A is a plot illustrating a simulated coupling factor for a tungsten layer below aluminum and a period of 2 µm.
Figure 9:
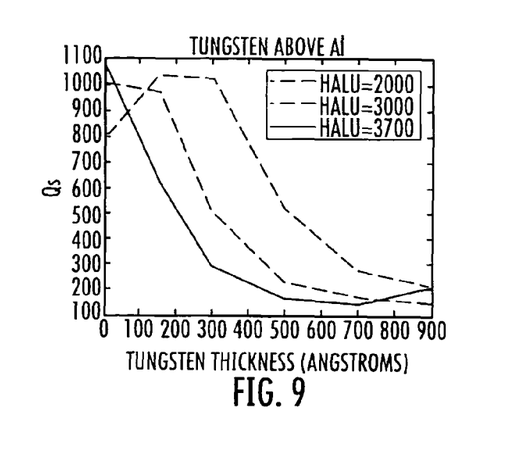
FIG. 9 is a plot illustrating a simulated resonance quality factor for a tungsten layer above aluminum and a period of 2 µm.
Figure 9A:
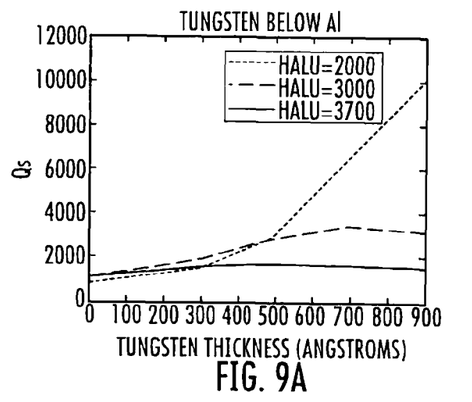
FIG. 9A is a plot illustrating a simulated resonance quality factor for tungsten layer below aluminum and a period of 2 µm.
Figure 10:
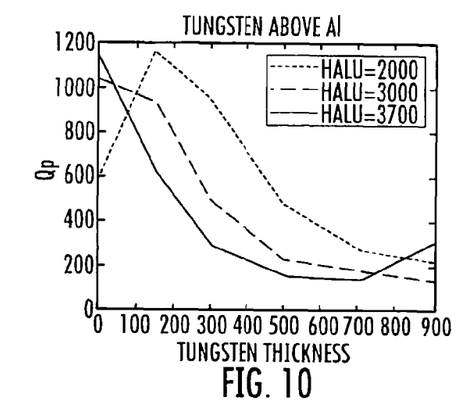
FIG. 10 is a plot illustrating a simulated anti-resonance quality factor for a tungsten layer above aluminum including a period of 2 µm.
Figure 10A:
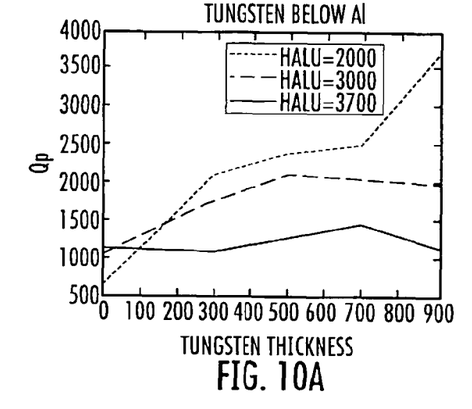
FIG. 10A is a plot illustrating a simulated anti-resonance quality factor for a tungsten layer below aluminum including a period of 2 µm.

As illustrated with continued reference to FIGS. 6A-6D, the standard resonator has losses above the resonance frequency, while the new resonator 10 phase curve is much closer to a desired rectangular shape. All parameters are improved as illustrated with reference to the table of FIG. 7. Similar results were obtained for a wide range of transverse periods 30 for placement of the obstacles 22. Desirable results corresponded to a relatively larger dot width/vertical period ratio. This ratio was 0.6 for the resonator 10 herein illustrated. This technique may be applied to a variety of SAW devices with different variants. One variant places the obstacles 22 below the electrodes 28. An approximate simulation can be done by assuming that the tungsten layer has a uniform thickness. FIGS. 8 to 10 illustrate the simulated coupling factor, Q at resonance and Q at anti-resonance for a resonator having a layer of Tungsten above Aluminum.

According to the simulation, when the tungsten is above the aluminum, a desirable quality factor is obtained for an aluminum thickness (h) lower than 3000 angstrom, corresponding to a normalized thickness h/(2p) of 0.075 while the thickness hw of tungsten is between 100 and 300 angstroms for the uniform layers. In the case of dots, the thickness of the dots is divided by the ratio of the dot vertical width on the vertical period. Assuming a ratio close to 0.5, this corresponds for the dots to a normalized thickness of tungsten hw/2p between 0.005 and 0.015. When the tungsten is below the aluminum, all parameters are improved and the quality factors are increasing when the tungsten thickness are increasing.

The examples above use tungsten for the dots. This was chosen for its high acoustic impedance leading to a desirable reflectivity. The invention gives similar results with other materials. Materials may include conductors or dielectrics. In the case where dielectric materials are used, the obstacles 22 may be strips rather than dots. In addition, instead of adding material to the transducer 12, the surface 14 of the substrate 16 may be grooved. To efficiently avoid energy radiated outside the active area of the device, dummy electrodes 40, as illustrated with reference to FIGS. 4 and 5, may be used. In addition, the dots or strips can extend into the bus-bar 42.

The invention may include a variety of surface waves such as Rayleigh waves, surface transverse waves, leaky waves or other elastic waves that can be excited by interdigitated transducers. By way of further example, the invention may be used for boundary elastic waves propagating at an interface between two materials.

Figure 11:
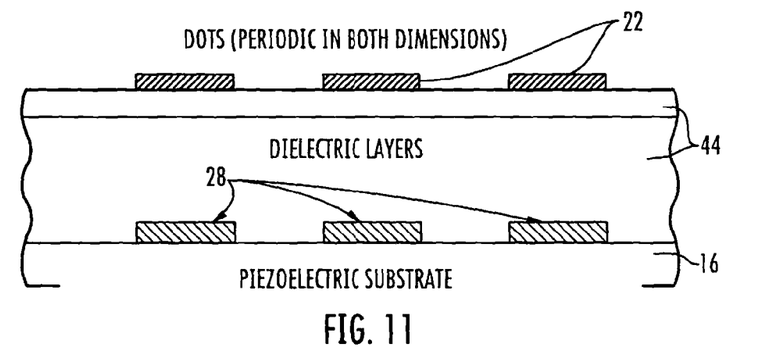
FIG. 11 is a diagrammatical cross section view of buried IDT devices with improved energy confinement, a top view thereof being similar to FIG. 4 or FIG. 5 herein described.

The obstacles 22 do not have to be in contact with the electrodes 28. By way of example, if the transducer 12 is buried inside a dielectric material 44 used to reduce the temperature drift of the acoustic device, the obstacles 22 may be above the dielectric material 44 as illustrated with reference to FIG. 11a. If the thickness of the dielectric material is sufficiently small so that some acoustic energy exists at the surface, then the obstacles will act as reflectors. This is possible even if more than one layer of material is above the electrodes as herein illustrated by way of example. As previously described with reference to FIG. 4, these obstacles 22 are periodic as well aligned in the transverse direction and in the longitudinal (propagation) direction.

Figure 12:
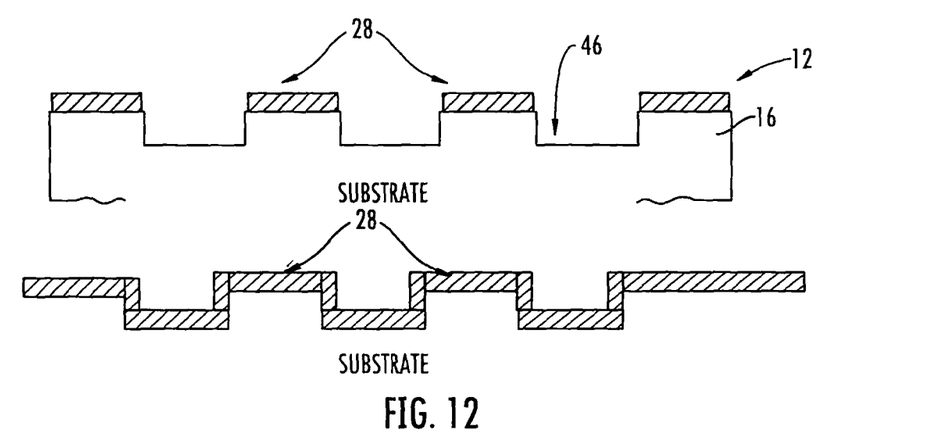
FIG. 12 is a partial diagrammatical illustration of one embodiment according to the teachings of the present invention using grooves, wherein the upper illustration is a cross section view perpendicular to the electrodes, and the lower illustration is a cross section view along one electrode.
Figure 12A:
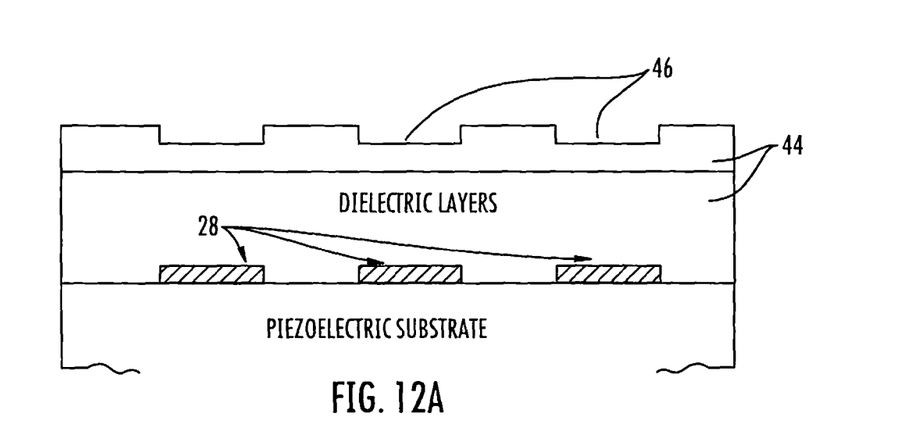
FIG. 12A is a partial diagrammatical illustration of a buried IDT device with improved energy confinement using grooves, a top view being similar to the embodiments of FIG. 4 or FIG. 5 herein described.

Alternatively, several structures will come to the mind of those skilled in the art now having the benefit of the teachings of the present invention. By way of example, similar desirable results are obtained by selectively etching the substrate 16 (or dielectric layer as illustrated with reference to FIG. 12A, if included) to form grooves 46 as illustrated with reference to FIG. 12.

Figure 13:
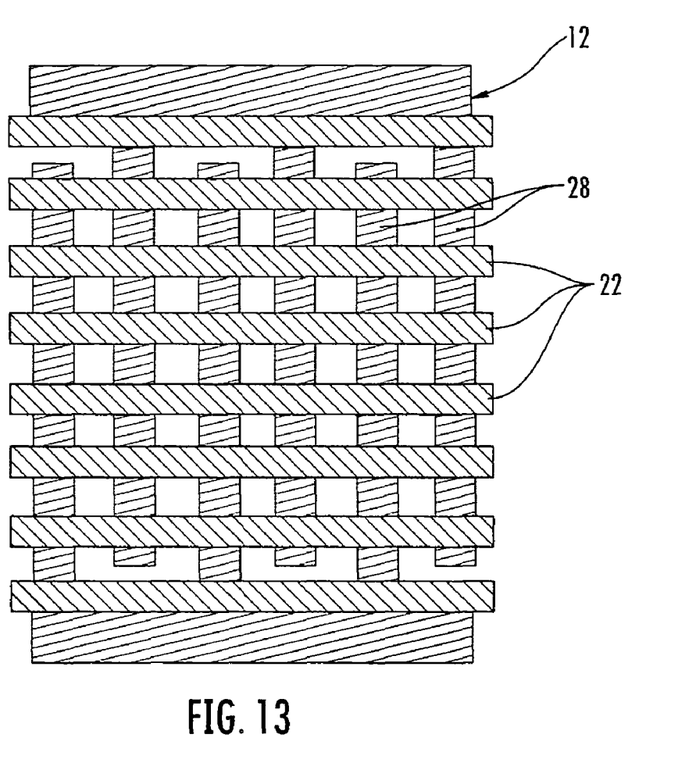
FIG. 13 is a diagrammatical illustration of a configuration using tape obstacles, wherein the obstacles may be made by grooves or material deposition on top of the oxide for buried IDTs, and by dielectric deposition above or below the transducers or by grooving the substrate below the transducers.

By way of further example, transducers 12 and resonators may include periodically placed obstacles 22 formed as strips of reflective material aligned generally perpendicular to the electrodes 28. One embodiment may comprise tape shaped obstacles 22 to confine the energy, as illustrated with reference to FIG. 13. With this implementation, one has to be careful not to short circuit the transducers electrodes. For buried IDTs devices, the obstacles 22 may be grooves or metal at the surface of the oxide. If no oxide is present, a dielectric material can be deposited above or below the electrodes. One embodiment may include etching the substrate 16 before depositing the transducer 12.

For the above described embodiment illustrated with reference to FIG. 4, by way of example, the obstacle (reflector) centers 22C may be aligned with the electrode centers 28C. This need not be the only structure. It is known to SAW designers that a shift between reflections centers and transduction centers can be advantageous to make a unidirectional transducer. This may be done by shifting the center axis 22A of the obstacles 22 from the center axis 28A of the electrodes 28, as illustrated with reference to FIG. 14. If the reflection on the electrodes 22 is negligible compared to the reflection of the obstacle 28, a shift of one eighth of the wavelength will give a desired unidirectionality. Unidirectionality may still be obtained by using a different shift in the electrode. One embodiment of the present invention including a unidirectional transducer with improved energy confinement is illustrated with reference to FIG. 14. Filter responses may be improved by varying the reflectivity along the transducers and in some cases having regions of the transducers including a shift between reflection and transduction corresponding to a backward unidirectionality. This is provided by an appropriate arrangement of the obstacles.

Figure 14:
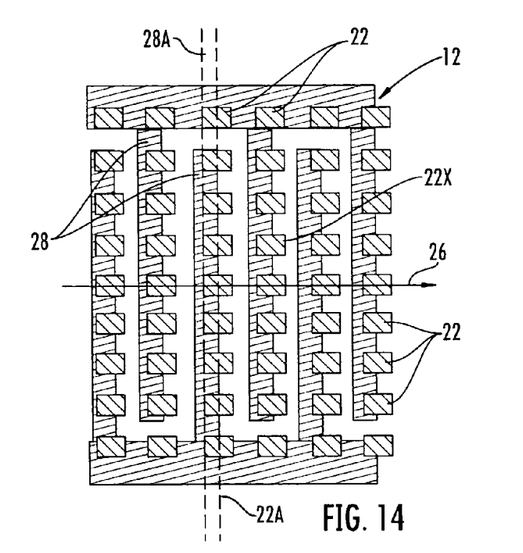
FIG. 14 is a diagrammatical example of a unidirectional transducer with improved confinement.

With continued reference to FIG. 14, material above the electrodes or below is used to provide the energy confinement. If this is used in the buried IDT configuration, the obstacle may be placed above the dielectric layers. Alternatively, grooves may be used.

It is known that a succession of reflective electrodes and non reflective electrodes with an adequate shift allows designing unidirectional transducers. These transducers are often called SPUDT (single phase unidirectional transducers). An example of a SPUDT device uses EWC (electrode width control) or DART (distributed acoustic reflection transducer). The non reflective electrodes have a period of a quarter wavelength. By way of example, the energy confinement may be obtained by adding the 2-D array of obstacles 22 only above or below the reflective electrodes 28R as illustrated with reference to FIG. 15.

Figure 15:
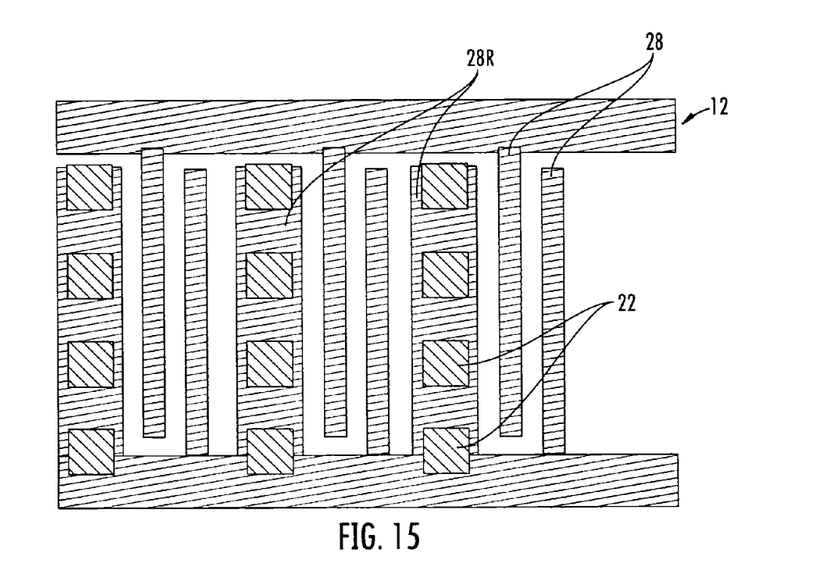
FIG. 15 is a diagrammatical example of a SPUDT with improved confinement.
Figure 16:
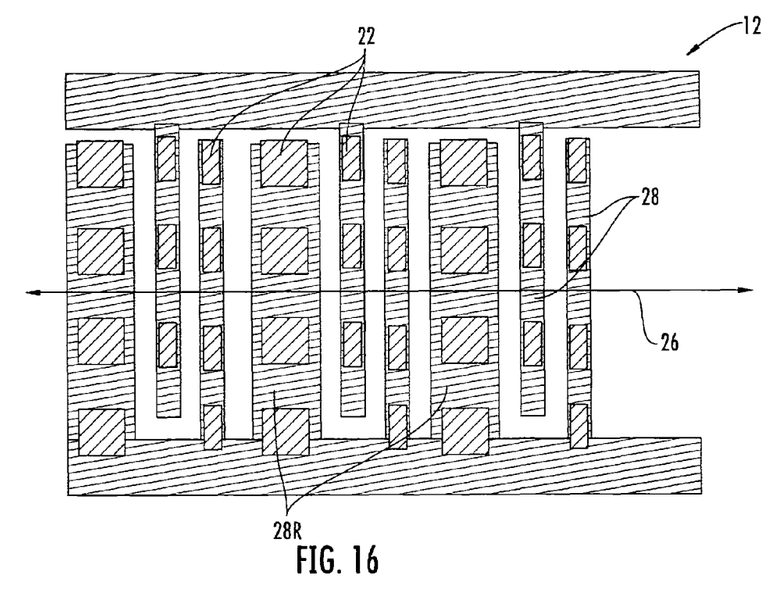
FIG. 16 is a second diagrammatical example of a SPUDT with improved confinement.

FIG. 16 illustrates another example of a SPUDT where the obstacles 22 are placed on all the electrodes 28, 28R, unlike the embodiment of FIG. 15. The obstacles 22 may be placed on (or below) all electrodes including the non reflective electrodes. In this case, in the longitudinal direction 26, the reflectivity of the obstacles on the non reflective electrodes is zero (a quarter of wave length of distance), while a reflectivity still exists in the other directions.

Different effects can be obtained when removing one or several obstacles 22 from within the 2-D grating array. By way of example with reference again to FIG. 14, obstacle 22X may be removed. This introduces defects in a crystal. By removing one obstacle in the array, a cavity results. At a one frequency or well defined frequency range, the energy is concentrated inside the cavity. Removing one row, by way of further example, a row along the longitudinal direction 26 results in a wave guide, wherein the energy is traveling inside the missing row. It is also possible to couple a waveguide and a cavity. In this case, the energy is traveling in the waveguide except for a specific frequency where it is concentrated in the cavity. Those of skill in the art will appreciate similar approaches can be used for the obstacles, now having the benefit of the teachings of the present invention.

Figure 17:
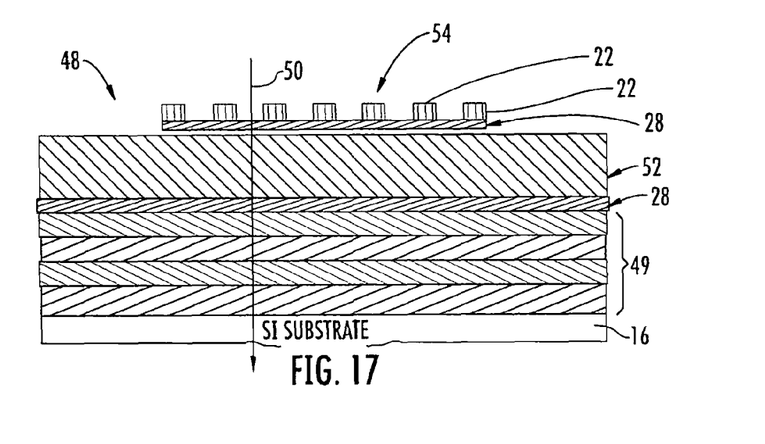
Figure 17A:
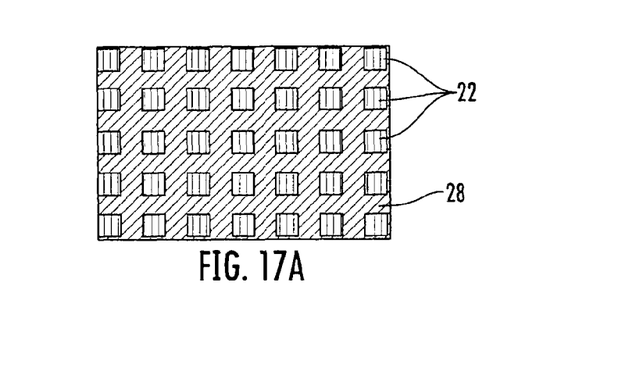

By way of example for a BAW resonator 48, the energy may be radiated outside its resonator resulting in degraded losses. An approach according to the teachings of the present invention may be used to reflect the energy and confine it inside the resonator 48. A 2-D periodic grating of obstacles 22 may be introduced inside the resonator. For example, the obstacles 22 may be added above one of the electrodes 28. The period of the obstacles 22 is chosen to reflect the modes leaking the most energy. The same approach may be used for quartz resonators or thin film BAW devices. FIG. 17 illustrates one diagrammatical schematic of a BAW resonator 48 by way of example. As earlier described, the BAW resonator 48 may comprise a Bragg reflector 49 isolating the resonator from the substrate 16 and confining the energy in a first direction 50 (a primary wave direction for BAW) through the thickness of a piezoelectric layer 52 and the two dimensional grating 54 of obstacles 22 for confining the energy in directions other than the primary wave propagation direction 50.

Figure 18:
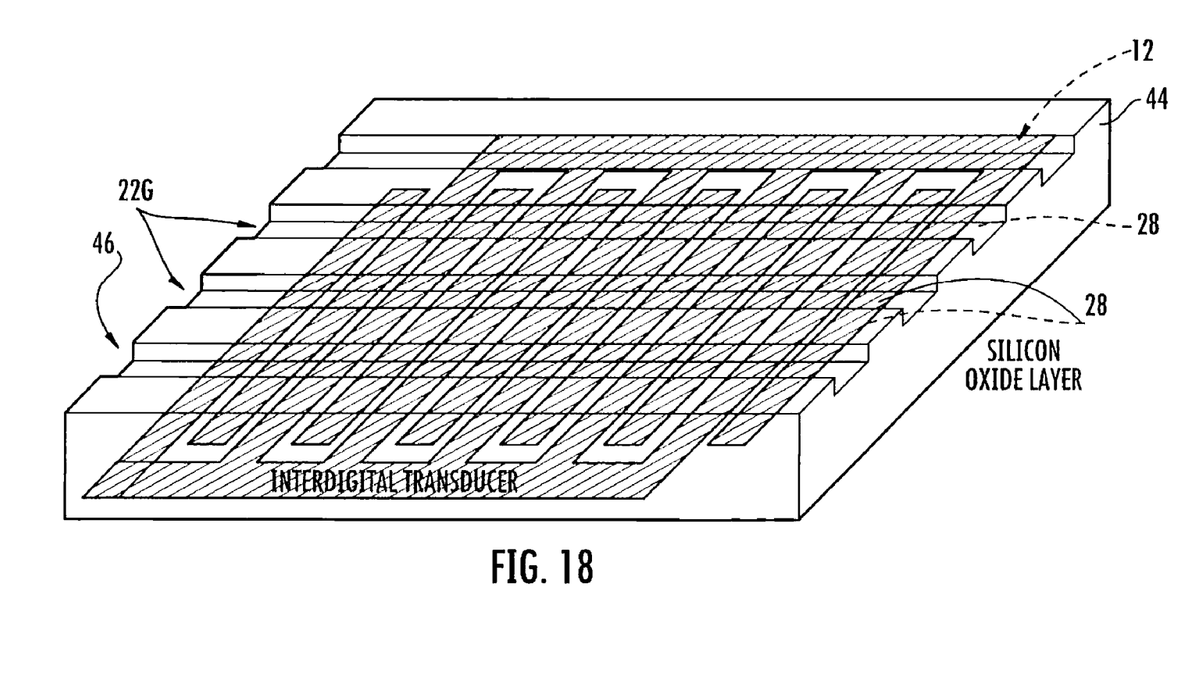
FIG. 18 is a partial perspective diagrammatical view of a resonator according to the teachings of the present invention.
Figure 19A:
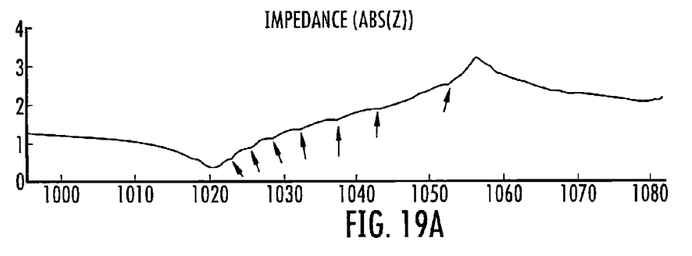
FIGS. 19A and 19B illustrate impedance and phase responses, respectively, for a well known resonator.
Figure 19B:
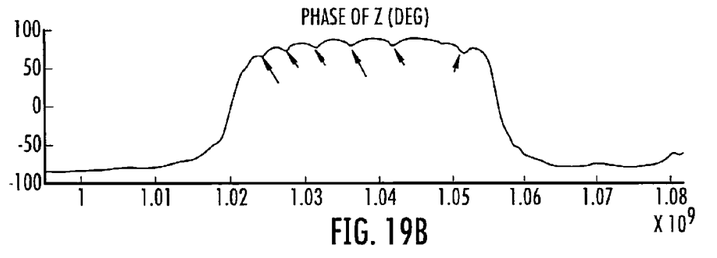
Figure 20A:
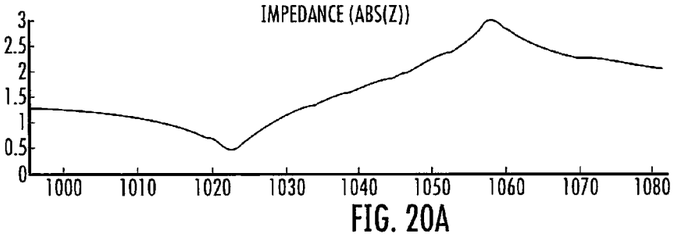
FIGS. 20A and 20B illustrate impedance amplitude and phase responses, respectively, for the resonator of FIG. 18 as modified according to the teachings of the present invention by addition of strip shaped grooves as obstacles.
Figure 20B:
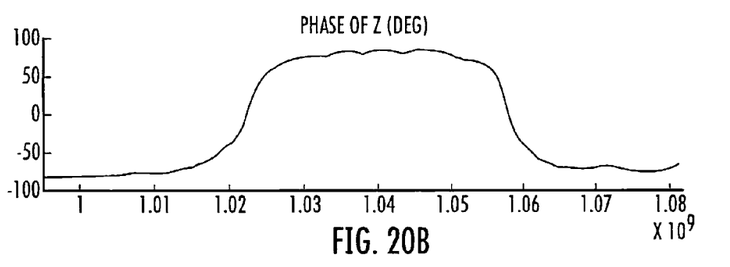

By way of example, test results have shown desirable results from embodiments of the invention. The teachings of the present invention were applied for resonators in one case where a dielectric layer is above the transducer to reduce the temperature sensitivity, as illustrated with reference to FIG. 18. The substrate is a 128 degree cut Lithium Niobate substrate. The period of the electrodes is 1.8 microns. The obstacles 22 herein formed as grooves 22G. The transducers/gratings are made essentially of copper. The metal thickness is about 1800 Angstroms. The electrodes 28 are buried inside Silicon Oxide and thickness of 7000 Angstrom of Silicon Oxide is added on top of the transducer 12 (total thickness of oxide is about 8800 A). To illustrate a desirable result and satisfaction of a need in the art, FIGS. 19A and 19B are presented to illustrate impedance amplitude and phase of a standard resonator. Strong spurious effects due to transverse modes can be seen on the responses and are herein identified using arrows. FIGS. 20A and 20B illustrate results obtained for the same resonator producing the results of FIGS. 18a and 18b, when strip shaped grooves are etched on top of the oxide orthogonally to the electrodes. The period of the grooves is 6 μm and their depth is about 1000 A. It can clearly be seen from the responses that the amplitude of the spurious effects due to the transverse mode is desirably reduced as a result of the grooves.

Many modifications and other embodiments of the invention will come to the mind of one skilled in the art having the benefit of the teachings presented in the foregoing descriptions and associated drawings. Therefore, it is understood that the invention is not to be limited to the specific embodiments disclosed, and that modifications and embodiments are intended to be included within the scope of the appended claims.

That which is claimed is:

1. An acoustic wave device comprising:
a piezoelectric material;
metallic electrodes carried by the piezoelectric material such that a difference of potential between two adjacent electrodes generates elastic energy by piezoelectric effect, wherein a primary wave propagation of acoustic waves is along a primary wave propagation path generally perpendicular to the metallic electrodes; and
a plurality of obstacles reflecting at least a portion of the acoustic waves, the plurality of obstacles positioned generally parallel to a surface of the piezoelectric material for confining the elastic energy along the primary wave propagation path, wherein obstacles within the plurality of obstacles are separated by a preselected periodicity, and wherein at least one direction of periodicity is parallel to the metallic electrodes.

2. An acoustic wave device according to claim 1, wherein the preselected periodicity includes an integer number of a half wavelengths of a preselected acoustic wave generated by the metallic electrodes.

3. An acoustic wave device according to claim 1, wherein the preselected periodicity does not exceed three elastic wavelengths.

4. An acoustic wave device according to claim 1, wherein the metallic electrodes form an interdigitated transducer (IDT) and the obstacles form a two dimensional array of obstacles.

5. An acoustic wave device according to claim 4, wherein the periodicity of the obstacles is essentially the same as the periodicity of the electrodes of the IDT.

6. An acoustic wave device according to claim 4, wherein the periodicity of the obstacles is sufficiently small to allow more than 5 periods in an aperture of the IDT.

7. An acoustic wave device according to claim 4, wherein the IDT is positioned between two reflectors so as to form a resonator having periodic metallic electrodes, and wherein the array obstacles is such that the periodicity of the obstacles is essentially the same as the periodicity of the reflectors.

8. An acoustic wave device according to claim 1, wherein the plurality of obstacles comprise a dotted metallic layer deposited on a surface of the metallic electrodes.

9. An acoustic wave device according to claim 8, wherein the dotted metallic layer is deposited on at least one of an upper surface and a lower surface of the metallic electrodes.

10. An acoustic wave device according to claim 8, wherein the obstacles comprise the dotted metallic layer having dots separated on the electrodes by a least one dielectric layer.

11. An acoustic wave device according to claim 8, wherein the dotted metallic layer comprises tungsten.

12. An acoustic wave device according to claim 1, wherein the obstacles comprise strips of a dielectric material attached to at least one of above and below the electrodes.

13. An acoustic wave device according to claim 1, wherein the obstacles are strips of material separated from the electrodes by a dielectric material.

14. An acoustic wave device according to claim 1, wherein the obstacles are elongate grooves in a dielectric material carried on an upper surface of the electrodes.

15. An acoustic wave device according to claim 1, wherein the obstacles comprise at least one of an elongate groove within a surface of the piezoelectric substrate, a strip of material thereon, an etching therein, and a dot of material thereon.

16. An acoustic wave device according to claim 1, wherein the obstacles comprise at least one of Molybdenum, Aluminum, Silicon Nitride, Aluminum Nitride, and Silicon Oxide.

17. An acoustic wave device according to claim 1, wherein the obstacles comprise grooves formed on the surface of the metallic electrodes.

18. An acoustic wave device according to claim 1, wherein an alignment of obstacle centers and an alignment of electrode centers are shifted to provide unidirectionality.

19. An acoustic wave device according to claim 1, wherein the electrodes and the plurality of obstacles form a SAW filter comprising at least one of a SAW transducer and a resonator.

20. An acoustic wave device according to claim 1, wherein the metallic electrodes and the plurality of obstacles form a bulk acoustic wave (BAW) resonator, and wherein the plurality of obstacles form a two dimensional array of obstacles carried generally perpendicular to the primary wave propagation path.

21. An acoustic wave device according to claim 20, further comprising a Bragg reflector isolating the BAW resonator from the piezoelectric material and confining the energy in a first direction corresponding to the thickness of a piezoelectric layer and the two dimensional grating of obstacles for confining the energy in other directions.

22. An acoustic wave device according to claim 1, wherein the plurality of obstacles form an array of obstacles aligned along first and second axes, and wherein a periodicity of obstacles within the axes is interrupted by at least one obstacle being missing from the array.

23. An acoustic wave device according to claim 22, wherein the at least one missing obstacles provides at least one of a cavity and a wave guide within the plurality of obstacles.

24. An acoustic wave device comprising:
a piezoelectric substrate;
metallic electrodes carried by the piezoelectric substrate such that a difference of potential between two adjacent electrodes generates elastic energy by piezoelectric effect, wherein a primary wave propagation is along a primary wave propagation path generally perpendicular to the metallic electrodes; and
a plurality of obstacles operably reflecting acoustic waves, the plurality of obstacles positioned generally within a two dimensional array, wherein periodicities of obstacles within the array are along the primary wave propagation path and perpendicular to the primary propagation path.

* * * * *